US005604375A

United States Patent [19]

Findikoglu et al.

[11] Patent Number: 5,604,375

[45] Date of Patent: Feb. 18, 1997

[54] SUPERCONDUCTING ACTIVE LUMPED COMPONENT FOR MICROWAVE DEVICE APPLICATION

[75] Inventors: Alp T. Findikoglu, College Park, Md.; Michitomo Iiyama, Osaka, Japan

[73] Assignees: Sumitomo Electric Industries, Ltd., Osaka, Japan; University of Maryland, College Park, Md.

[21] Appl. No.: 202,570

[22] Filed: Feb. 28, 1994

[51] Int. Cl.[6] .......... H01L 39/00

[52] U.S. Cl. .......... 257/661; 505/237; 505/703; 505/866

[58] Field of Search .......... 257/32, 33, 661–663; 505/210, 237, 238, 239, 703, 782, 783, 856, 866, 870; 250/336.2

[56] References Cited

U.S. PATENT DOCUMENTS

| | | | |
|---|---|---|---|
| 4,697,143 | 9/1987 | Lockwood et al. | 324/158 P |
| 4,837,536 | 6/1989 | Honjo | 257/33 |
| 4,970,395 | 11/1990 | Kruse, Jr. | 250/336.2 |
| 5,219,827 | 6/1993 | Higaki et al. | 505/1 |
| 5,256,636 | 10/1993 | Wellstood et al. | 505/1 |
| 5,291,035 | 3/1994 | Wellstood et al. | 257/661 |
| 5,329,261 | 7/1994 | Das | 333/17.2 |
| 5,472,935 | 12/1995 | Yandrofski et al. | 505/210 |

FOREIGN PATENT DOCUMENTS

| | | | |
|---|---|---|---|
| 0483784 | 5/1992 | European Pat. Off. | 257/662 |
| 0508893 | 10/1992 | European Pat. Off. | 257/662 |
| 472777 | 3/1992 | Japan | 257/661 |

OTHER PUBLICATIONS

Hermann, A. M., et al., Bulletin of American Phys. Soc., vol. 38, No. 1, p. 689 (1993).

Galt, David, et al., Bulletin of American Phys. Soc., vol. 38, No. 1, p. 840 (1993).

Findikoglu, T., et al., Bulletin of American Phys. Soc., vol. 38, No. 1, p. 838 (1993).

*Tunable Microwave Devices Receive U.S. Patent,* Wireless Business & Technology, Mar. 1996, p. 14.

Galt et al., "Characterization of a tunable thin film microwave $YBa_2Cu_3O_{7-x}/SrTiO_3$ coplanar capacitor," Appl. Phys. Lett. 63 (22), 29 Nov. 1993, pp. 3078–3080.

Babbit et al., "Planar Microwave Electro–optic Phase Shifters," Microwave Journal, Jun. 1992, pp. 63–79.

Varadan et al., "Ceramic Phase Shifters for Electronically Steerable Antenna Systems," Microwave Journal, Jan. 1992, pp. 116–127.

Findikoglu et al., "A noncontact cryogenic microwave measurement system for superconducting device characterization," Rev. Sci. Instrum. 65 (9), Sep. 1994, pp. 2912–2915.

Laskar et al., "An On–Wafer Cryogenic Microwave Probing System for Advanced Transistor and Superconductor Applications," Microwave Journal, Feb. 1993, pp. 108–114.

Findikoglu et al., "Effect of dc electric field on the effective microwave surface impedance of $YBa_2Cu_3O_7/SrTiO_3/YBa_2Cu_3O_7$ trilayers," Appl. Phys. Lett. 63 (23), 6 Dec. 1993, pp. 3215–3217.

Ramesh et al., "Ferroelectric $PbZr_{0.2}Ti_{0.8}O_3$ thin films on epitaxial Y–Ba–Cu–O," Appl. Phys. Lett., vol. 59, No. 27, Dec. 1991; pp. 3542–3544.

Hermann et al., "Oxide Superconductors and Ferroelectrics–Materials for a New Generation of Tunable Microwave Devices," Journal of Superconductivity, vol. 7, No. 2, 1994, pp. 463–469.

Lancaster et al. "Superconducting microwave resonators," IEE Proceedings–H, vol. 139, No. 2, Apr. 1992, pp. 149–156.

*Primary Examiner*—Sara W. Crane
*Attorney, Agent, or Firm*—Foley & Lardner

[57] ABSTRACT

A superconducting active lumped component for microwave device application including a dielectric substrate, a first superconducting portion of an oxide superconductor provided on said dielectric substrate, an insulator layer formed on the first superconducting portion and a second conductive portion arranged on the insulator layer in which the conductivity of the first superconducting electrode and the dielectric property of the insulator layer can be changed by a dc bias voltage applied between the first and the second conductive portion so that capacitance and/or inductance and/or microwave resistance can be changed.

14 Claims, 1 Drawing Sheet

SUPERCONDUCTING ACTIVE LUMPED COMPONENT FOR MICROWAVE DEVICE APPLICATION

BACKGROUND OF THE INVENTION

1. Field of the Invention

The present invention relates to a superconducting active lumped component for microwave device application, and particularly to a superconducting active lumped component for microwave device application of which properties can be changed during operation.

2. Description of Related Art

Electromagnetic waves called "microwaves" or "millimetric waves" having a wavelength ranging from a few tens of centimeters to a few millimeters can be theoretically said to be merely a part of an electromagnetic wave spectrum, but in many cases, have been considered from the viewpoint of electrical engineering as being a special independent field of the electromagnetic waves, since special and unique methods and devices have been developed for handling these electromagnetic waves.

In the case of propagating an electromagnetic wave in microwave and millimetric wave frequency bands, a twin-lead type feeder used in a relative low frequency band has an extremely large transmission loss. In addition, if an inter-conductor distance approaches a wavelength, a slight bend of the transmission line and a slight mismatch in connection portion cause reflection and radiation, and is easily influenced from adjacent objects due to electomagnetic interference. Thus, a tubular waveguide having a sectional size comparable to the wavelength has been conventionally used. The waveguide and a circuit constituted of the waveguide constitute a three-dimensional circuit, which is larger than components used in ordinary electric and electronic circuits. Therefore, use of microwave circuits has been limited to special fields.

However, miniaturized devices composed of semiconductor materials have been developed as an active element operating in a microwave band. In addition, with the advancement of integrated circuit technology, so-called microstrip lines having a extremely small inter-conductor distance have been used.

In general, the microstrip line has an attenuation coefficient that is attributable to a resistance component of the conductor. This attenuation coefficient, attributable to the resistance component, increases in proportion to a root of the frequency. On the other hand, the dielectric loss increases in proportion to increase of the frequency. However, the loss in more recent microstrip lines is attributable almost exclusively to the resistance of the conductor in a frequency region not greater than 10 GHz, due to the improvement dielectric materials. Therefore, if the resistance of the conductor in the strip line can be reduced, it is possible to greatly elevate the performance of the microstrip line. Namely, by using a superconducting microstrip line, the loss can be significantly decreased and microwaves of higher frequency range can be transmitted.

As well known, the microstrip line can be used as a simple signal transmission line. In addition, if a suitable patterning is applied, the microstrip line can be used as microwave components including an inductor, a capacitor, a filter, a resonator, a delay line and a transistor etc. Accordingly, improvement of the microstrip line will lead to improvement of characteristics of the microwave component.

In addition, the oxide superconductor material (high $T_c$ copper oxide superconductor) which has been recently discovered makes it possible to realize a superconducting state at temperatures achievable by low cost liquid nitrogen cooling. Therefore, various microwave components using an oxide superconductor have been proposed.

It is well known that lumped components are favorable in their size compared with distributed components. Due to their small size, the lumped components can be easily combined with other distributed or lumped components so as to form hybrid circuits.

By using the oxide superconductors for the lumped components, the dissipation and dispersion is considered to be significantly smaller than those of conventional metals or semiconductors.

However, it is almost impossible to change properties of the lumped components after they are assembled into circuits.

SUMMARY OF THE INVENTION

Accordingly, it is an object of the present invention to provide a lumped component which has overcome the above mentioned defect of the conventional ones.

The above and other objects of the present invention are achieved in accordance with the present invention by a superconducting active lumped component for microwave including a dielectric substrate, a first superconducting portion of an oxide superconductor provided on said dielectric substrate, an insulator layer formed on the first superconducting portion and a second conductive portion arranged on the insulator layer in which the conductivity of the first superconducting electrode and/or the dielectric property of the insulator layer can be changed by a dc bias voltage applied between the first and the second conductive portion so that surface reactance and/or surface resistance of the device can be changed.

Since the oxide superconductor has low carrier density, its conductivity can be easily varied by applying an electric field, which is one of its distinctive properties. The superconducting active lumped component for microwave in accordance with the present invention, the second conductive portion is a superconducting portion of the same oxide superconductor as the first superconducting portion, or a different type oxide superconductor from the first superconducting portion.

In the superconducting active lumped component for microwave in accordance with present invention, the dielectric substrate is preferably formed of a material selected from the group consisting of MgO, $SrTiO_3$, $NdGaO_3$, $Y_2O_3$, $LaAlO_3$, $LaGaO_3$, $Al_2O_3$, $ZrO_2$, Si, GaAs, sapphire and fluorides.

The superconducting active lumped component for microwave in accordance with present invention preferably comprises a dielectric substrate, a superconducting groundplane of an oxide superconductor provided on said dielectric substrate, an insulator layer formed on the superconducting groundplane and a patterned superconducting transmission line of an oxide superconductor arranged on the insulator layer in which the conductivity of the superconducting ground plane, the dielectric property of the insulator layer and the conductivity of the patterned superconducting transmission line can be changed by a dc bias voltage applied between the superconducting ground plane and the patterned superconducting transmission line so that inductance of the superconducting active lumped component is shifted and/or microwave resistance of the superconducting active lumped component is changed.

In this case, the superconducting active lumped component for microwave in accordance with present invention becomes a superconducting inductor.

The superconducting active lumped component for microwave in accordance with present invention also preferably comprises a dielectric substrate, a patterned superconducting transmission line of an oxide superconductor provided on said dielectric substrate, an insulator layer formed on the superconducting groundplane and a bias electrode arranged on the insulator layer in which the conductivity of the patterned superconducting transmission line and the dielectric property of the insulator layer can be changed by a dc bias voltage applied between the patterned superconducting transmission line and the bias electrode so that capacitance of the superconducting active lumped component is shifted and/or microwave resistance of the superconducting active lumped component is changed.

In this case, the superconducting active lumped component for microwave in accordance with present invention becomes a superconducting capacitor.

The superconducting signal conductor layer and the superconducting groundplane of the microwave component in accordance with the present invention can be formed of thin films of general oxide superconductor materials such as a high critical temperature (high-Tc) copper-oxide type oxide superconductor material typified by a Y—Ba—Cu—O type compound oxide superconductor material, a Bi—Sr—Ca—Cu—O type compound oxide superconductor material, and a Tl—Ba—Ca—Cu—O type compound oxide superconductor material, a Hg—Ba—Sr—Ca—Cu—O type compound oxide superconductor material, a Nd—Ce—Cu—O type compound oxide superconductor material. In addition, deposition of the oxide superconductor thin film can be exemplified by a sputtering process, a laser ablation process, co-evaporation process, etc.

The substrate can be formed of a material selected from the group consisting of MgO, $SrTiO_3$, $NdGaO_3$, $Y_2O_3$, $LaAlO_3$, LaGaO3, $Al_2O_3$, $ZrO_2$, Si, GaAs, sapphire and fluorides. However, the material for the substrate is not limited to these materials, and the substrate can be formed of any oxide material which does not diffuse into the high-Tc copper-oxide type oxide superconductor material used, and which substantially matches in crystal lattice with the high-Tc copper-oxide type oxide superconductor material used, so that a clear boundary is formed between the oxide insulator thin film and the superconducting layer of the high-Tc copper-oxide type oxide superconductor material. From this viewpoint, it can be said to be possible to use an oxide insulating material conventionally used for forming a substrate on which a high-Tc copper-oxide type oxide superconductor material is deposited.

A preferred substrate material includes a MgO single crystal, a $SrTiO_3$ single crystal, a $NdGaO_3$ single crystal substrate, a $Y_2O_3$, single crystal substrate, a $LaAlO_3$ single crystal, a $LaGaO_3$ single crystal, a $Al_2O_3$ single crystal, and a $ZrO_2$ single crystal.

For example, the oxide superconductor thin film can be deposited by using, for example, a (100) surface of a MgO single crystal substrate, a (110) surface or (100) surface of a $SrTiO_3$ single crystal substrate and a (001) surface of a $NdGaO_3$ single crystal substrate, as a deposition surface on which the oxide superconductor thin film is deposited.

Several materials are suitable for the insulating layer, such as $SrTiO_3$, MgO, $BaTiO_3$, $NdGaO_3$, $CeO_2$. Generally, any material which is insulating is acceptable. However, for devices where the modulation is dominated by the changes in the dielectric properties of the insulating layer, it is more desirable to use more ionic dielectrics, piezoelectrics and ferroelectrics such as lead zirconium titanate (PLZT) or lead barium strontium titanate ((Pb, Ba, Sr)$TiO_3$).

The above and other objects, features and advantages of the present invention will be apparent from the following description of preferred embodiments of the invention with reference to the accompanying drawings However, the examples explained hereinafter are only for illustration of the present invention, and therefore, it should be understood that the present invention is in no way limited to the following examples.

DESCRIPTION OF THE PREFERRED EMBODIMENTS

Figure 1A:
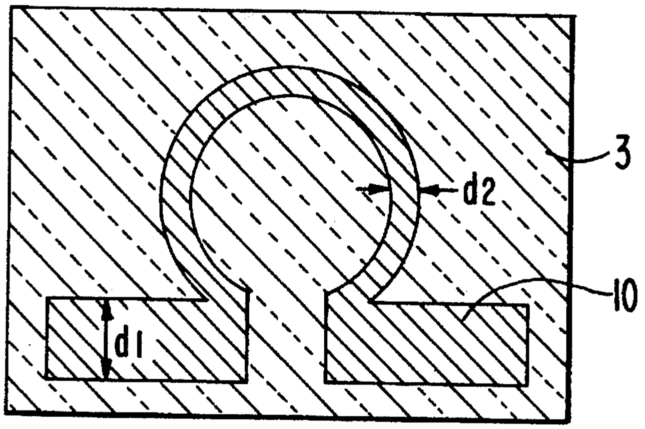
FIG. 1A is a plane sectional view showing a superconducting inductor in accordance with the present invention.
Figure 1B:
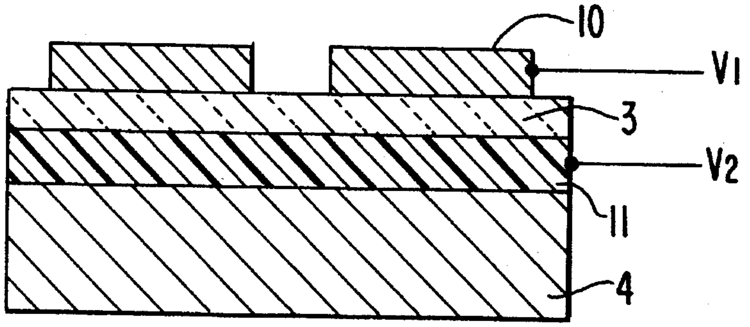
FIG. 1B is a diagrammatic sectional view of the superconducting inductor, shown in FIG. 1A.

Referring to FIGS. 1A and 1B, there is shown a diagrammatic plane view and sectional view showing a superconducting inductor which is an embodiment of the superconducting lumped components in accordance with the present invention.

The shown superconducting inductor comprises a substrate 4 formed of $LaAlO_3$, a superconducting groundplane 11 of a $Y_1Ba_2Cu_3O_{7-\delta}$ oxide superconductor and an insulator layer 3 of $SrTiO_3$ stacked in the named order on the substrate 4. On the insulator layer 3, a superconducting inductor of an Ω-shaped $Y_1Ba_2Cu_3O_{7-\delta}$ oxide superconductor thin film is arranged.

The first superconducting groundplane 11 has a thickness of 500 nanometers. The insulator layer 3 has a thickness of 800 nanometers.

In this connection, if a larger shift in dielectric property is required, a ferroelectric material such as Sr—Ba—Ti—O is preferably used for the insulator. Since, the dielectric property of $Sr_xBa_{1-x}TiO_3$ is more significantly influenced by an electric field.

The superconducting inductor 10 has a thickness of 200 nanometers. The straight portion of the inductor 10 has a width $d_1$ of 0.1 mm, and the circular portion of the inductor 10 has a width $d_2$ of 0.01 mm and a diameter of 0.4 mm with a gap of 0.02 mm.

Either the groundplane 11 or the inductor 10 can be formed of an oxide superconductor with opposite polarity of the charge carriers such as electron carrier type Nd—Ce—Cu—O ($Y_1Ba_2Cu_3O_{7-\delta}$ is a hole-carrier type superconductor). In this case, the response is influenced by all the changes in the inductor 10, the insulator layer 3 and the ground plane 11 in a comparable fashion In addition, conducting wires such as gold wires with appropriate microwave filters (not shown) are provided at the groundplane 11 and the superconducting inductor 10 in order to apply dc bias voltages $V_1$ and $V_2$.

By applying dc bias voltages $V_1$ and $V_2$ to the groundplane 11 and the superconducting inductor 10, conductivity of the $Y_1Ba_2Cu_3O_{7-\delta}$ oxide superconductor of the groundplane 11 and the superconducting inductor 12 and the dielectric property of the $SrTiO_3$ of the insulator layer 3 are changed so that the inductance and overall microwave resistance of the superconducting inductor vary.

The superconducting inductor shown in FIGS. 1A and 1B were manufactured by a following process.

On the substrate 4 formed of a square $LaAlO_3$ having each side of 15 mm and a thickness of 0.5 mm, the superconducting groundplane 11 was formed of a c-axis orientated $Y_1Ba_2Cu_3O_{7-\delta}$ oxide superconductor thin film having a thickness of 500 nanometers. This $Y_1Ba_2Cu_3O_{7-\delta}$ compound oxide superconductor thin film was deposited by co-evaporation. The deposition condition was as follows:

Evaporation source: Y, Ba, Cu (metals)

Gas: $O_2$ containing 70 mol % of $O_3$

Pressure: $1\times10^{-5}$ Torr

Substrate Temperature: 700° C.

Film thickness: 500 nanometers

Then, $SrTiO_3$ layer was deposited on the oxide superconductor thin film by co-evaporation. The deposition condition was as follows:

Evaporation source: Sr, Ti (metals)

Gas: $O_2$ containing 70 mol % of $O_3$

Pressure: $1\times10^{-5}$ Torr

Substrate Temperature: 400° C.

Film thickness: 800 nanometers

Thereafter, a c-axis orientated $Y_1Ba_2Cu_{3O7-\delta}$ oxide superconductor thin film having a thickness of 200 nanometers was stacked on the $SrTiO_3$ layer and was patterned into the shape shown in FIG. 1A by reactive ion etching. By this, the superconducting inductor in accordance with the present invention shown in FIG. 1A and 1B was completed.

For the superconducting inductor thus formed, a frequency characteristics of the transmission power can be measured by use of a network analyzer.

As mentioned above, the superconducting inductor in accordance with the present invention is constructed so that the inductance and/or resistance can be changed by a dc bias voltage.

Accordingly, the superconducting inductor in accordance with the present invention can be effectively used together with a capacitor in a local oscillator of microwave communication instruments, and the like.

Figure 2A:
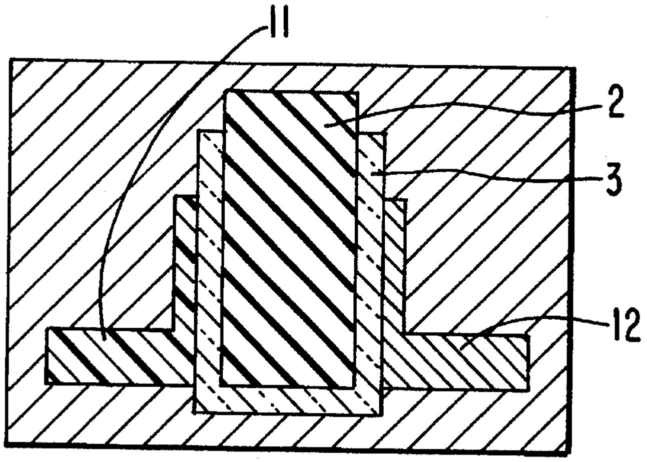
FIG. 2A is a plane sectional view showing a superconducting capacitor in accordance with the present invention.
Figure 2B:
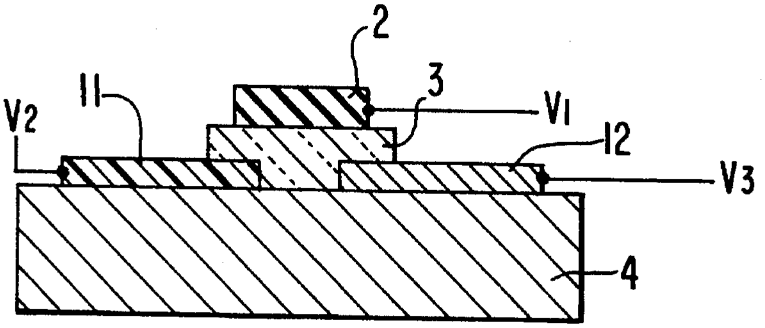
FIG. 2B is a diagrammatic sectional view of the superconducting capacitor, shown in FIG. 2A.

FIGS. 2A and 2B show a plane view and a sectional view of a superconducting capacitor which is a second embodiment of the superconducting lumped components in accordance with the present invention. The superconducting capacitor comprises a substrate 4 formed of $LaAlO_3$, a first and a second superconducting electrodes 11 and 12 of L-shaped $Y_1Ba_2Cu_3O_{7-\delta}$ oxide superconductor thin films formed on the substrate 4 separated from each other, an insulator layer 3 of $SrTiO_3$ stacked on the superconducting electrodes 11 and 12 and a bias electrode 2 stacked on the insulator layer. The first and second superconducting electrodes 11 and 12 are formed of a symmetrically patterned $Y_1Ba_2Cu_3O_{7-\delta}$ oxide superconductor thin films and have a thickness of 300 nanometers, a width of 0.01 mm, a dimension of 0.1×0.1 mm and a gap of 0.01 mm, and the insulator layer 3 has a thickness of 400 nanometers and a dimension of 0.1×0.2 mm. The bias electrode 2 has a thickness of 100 nanometers. The bias electrode 2 does not need to be a superconducting electrode so that a normal metal such as Au, Ag or Pt can be used.

However, the bias electrode 2 can be a superconducting electrode with opposite polarity of the charge carriers such as electron carrier type Nd—Ce—Cu—O ($Y_1Ba_2Cu_3O_{7-\delta}$ is a hole-carrier type superconductor). In this case, the response is influenced by all the changes in the superconducting electrodes 11 and 12, the insulator layer 3 and the bias electrode 2 in a comparable fashion In addition, conducting wires such as gold wires (not shown) with appropriate microwave filtering elements are provided on the first and second superconducting electrode 11 and 12 and the bias electrode 2 in order to apply dc bias voltages $V_1$, $V_2$ and $V_3$.

The superconducting capacitor shown in FIGS. 2A and 2B were manufactured by a following process.

On the substrate 4 was formed of a square $LaAlO_3$ having each side of 15 mm and a thickness of 0.5 mm, a c-axis orientated $Y_1Ba_2Cu_3O_{7-\delta}$ oxide superconductor thin film having a thickness of 300 nanometers was formed. This $Y_1Ba_2Cu_3O_{7-\delta}$ compound oxide superconductor thin film was deposited by co-evaporation. The deposition condition was as follows:

Evaporation source: Y, Ba, Cu (metals)

Gas: $O_2$ containing 70 mol % of $O_3$

Pressure: $1\times10^{-5}$ Torr

Substrate Temperature: 700° C.

Film thickness: 300 nanometers

Thereafter, the c-axis orientated $Y_1Ba_2Cu_3O_{7-\delta}$ oxide superconductor thin film was patterned into the shape shown in FIG. 2A by reactive ion etching so as to form the symmetrically arranged L-shaped superconducting electrodes 11 and 12.

Then, $SrTiO_3$ layer was deposited on the superconducting electrodes 11 and 12 by co-evaporation so as to form an insulator layer 3. The deposition condition was as follows:

Evaporation source: Sr, Ti (metals)

Gas: $O_2$ containing 70 mol % of $O_3$

Pressure: $1\times10^{-5}$ Torr

Substrate Temperature: 400° C.

Film thickness: 400 nanometers (max)

Thereafter, a bias electrode 2 of Au was formed on the insulator layer by vacuum evaporation so that the superconducting capacitor in accordance with the present invention shown in FIGS. 1A and 1B was completed.

For the superconducting capacitor thus formed, a frequency characteristics of the transmission power was measured by use of a network analyzer.

By locating the superconducting capacitor in accordance with the present invention in series with a passive superconducting inductor in a cryostat, a series LC resonator was formed. Resonant frequency was measured at temperatures of 20 K., while varying dc bias voltages was applied between the first and second superconducting electrodes and the bias electrode. The result of the measurement for a resonance on the order of 14 GHz is as follows:

| | |
|---|---|
| bias voltage (Volt) | 35 V |
| resonant frequency shift (MHz) | 200 MHz |

It will be noted that the resonant frequency of the superconducting capacitor in accordance with the present invention changed widely with the bias voltage.

As mentioned above, the superconducting capacitor in accordance with the present invention is so constructed that the resonant frequency can be changed by a dc bias voltage.

Accordingly, the superconducting capacitor in accordance with the present invention can be effectively used as an active element in a local oscillator of microwave communication instruments, and the like.

The invention has thus been shown and described with reference to the specific embodiments. However, it should be noted that the present invention is in no way limited to the details of the illustrated structures but changes and modifications may be made within the scope of the appended claims.

We claim:

1. A superconducting active lumped component for a microwave device comprising:

a substrate;

a first superconducting portion of an oxide superconductor provided on said substrate;

an insulator layer formed on the first superconducting portion;

a second conductive portion arranged on the insulator layer, wherein said substrate, said first superconducting portion, said insulator layer, and said second conductive portion form a superconducting active lumped component; and means for applying a dc bias voltage between the first superconducting portion and the second conductive portion, wherein one of a conductivity of the first superconducting portion and a dielectric property of the insulator layer is changed by said dc bias voltage such that one of a microwave reactance and a microwave resistance of the active lumped component is changed.

2. A superconducting active lumped component as recited in claim 1, wherein the second conductive portion is a superconducting portion of the same oxide superconductor as the first superconducting portion.

3. A superconducting active lumped component as recited in claim 1, wherein the second conductive portion is a superconducting portion of a different type oxide superconductor from the first superconducting portion.

4. A superconducting active lumped component as recited in claim 1, wherein said said substrate is a dielectric substrate formed of a material selected from the group consisting of MgO, $SrTiO_3$, $NdGaO_3$, $Y_2O_3$, $LaAlO_3$, $LaGaO_3$, $Al_2O_3$, $ZrO_2$, Si, GaAs, sapphire and fluorides.

5. A superconducting inductor, comprising:

a dielectric substrate;

a superconducting groundplane of an oxide superconductor provided on said dielectric substrate;

an insulator layer formed on the superconducting groundplane;

a patterned superconducting transmission line of an oxide superconductor arranged on the insulator layer; and means for applying a dc bias voltage between the superconducting groundplane and the patterned superconducting transmission line, wherein a conductivity of the superconducting groundplane, a dielectric property of the insulator layer, and a conductivity of the patterned superconducting transmission line are changed by said dc bias voltage such that one of a microwave inductance of the inductor is shifted and a microwave resistance of the inductor is changed.

6. A superconducting inductor as recited in claim 5, wherein the oxide superconductor is a high critical temperature copper-oxide type oxide superconductor material.

7. A superconducting inductor as recited in claim 6, wherein the oxide superconductor is a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material, a Hg—Ba—Sr—Ca—Cu—O type compound oxide superconductor material and a Nd—Ce—Cu—O type compound oxide superconductor material.

8. A superconducting capacitor comprising:

a dielectric substrate;

a patterned pair of superconducting electrodes of an oxide superconductor provided on said dielectric substrate;

an insulator layer formed on the superconducting groundplane;

a bias electrode arranged on the insulator layer; and means for applying a dc bias voltage between the pair of superconducting electrodes and the bias electrode, wherein a conductivity of the patterned pair of superconducting electrodes and a dielectric property of the insulator layer are changed by said dc bias voltage such that one of a microwave capacitance of the capacitor is shifted and a microwave resistance of the capacitor is changed.

9. A superconducting capacitor as recited in claim 8, wherein the oxide superconductor is a high critical temperature copper-oxide type oxide superconductor material.

10. A superconducting capacitor as recited in claim 9, the oxide superconductor is a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material, a Hg—Ba—Sr—Ca—Cu—O type compound oxide superconductor material and a Nd—Ce—Cu—O type compound oxide superconductor material.

11. A superconducting inductor as recited in claim 5, wherein said dielectric substrate, said superconducting groundplane, said insulator layer, and said patterned superconducting transmission line form a superconducting active lumped component.

12. A superconducting capacitor as recited in claim 8, wherein said dielectric substrate, said patterned pair of superconducting electrodes, said insulator layer, and said bias electrode form a superconducting active lumped component.

13. A superconducting active lumped component as recited in claim 1, wherein said applying means applies said dc bias voltage separately from a microwave signal.

14. A superconducting active lumped component as recited in claim 1, wherein said dc bias voltage is applied in a direction perpendicular to a direction in which a microwave signal transmits.

* * * * *